United States Patent
Primm et al.

(10) Patent No.: US 10,049,240 B2
(45) Date of Patent: Aug. 14, 2018

(54) ASSET TRACKING SYSTEM FOR RACK-BASED ENCLOSURES

(71) Applicant: RF CODE, INC., Austin, TX (US)

(72) Inventors: Michael R. Primm, Austin, TX (US); David Duncavage, Austin, TX (US); Ronald B. Graczyk, Cedar Park, TX (US); Ryan D. Joy, Austin, TX (US)

(73) Assignee: RF CODE, INC., Austin, TX (US)

( * ) Notice: Subject to any disclaimer, the term of this patent is extended or adjusted under 35 U.S.C. 154(b) by 0 days.

(21) Appl. No.: 15/412,647

(22) Filed: Jan. 23, 2017

(65) Prior Publication Data

US 2017/0213057 A1 Jul. 27, 2017

Related U.S. Application Data

(60) Provisional application No. 62/281,333, filed on Jan. 21, 2016, provisional application No. 62/281,339, filed on Jan. 21, 2016.

(51) Int. Cl.
*H04W 4/18* (2009.01)
*G06K 7/10* (2006.01)
(Continued)

(52) U.S. Cl.
CPC ............ *G06K 7/10366* (2013.01); *G01S 1/70* (2013.01); *H04W 4/185* (2013.01); *H04W 4/80* (2018.02); *H04W 8/005* (2013.01); *H05K 7/1498* (2013.01)

(58) Field of Classification Search
CPC ..... H04W 4/02; H04W 40/244; H04W 48/00; H04W 4/003; H04W 4/008; H04W 4/023; H04W 4/04; H04W 4/185; H04W 52/04; H04W 52/285; H04W 52/325; H04W 52/38; H04W 64/00; H04W 72/085; H04W 74/08; H04W 84/12; H04W 4/80;
(Continued)

(56) References Cited

U.S. PATENT DOCUMENTS

| | | |
|---|---|---|
| 8,837,954 B2 | 9/2014 | Primm et al. |
| 2008/0122581 A1* | 5/2008 | Bae ...................... G06K 7/0008 340/10.2 |

(Continued)

FOREIGN PATENT DOCUMENTS

| | | |
|---|---|---|
| WO | 2007072400 A2 | 6/2007 |
| WO | 2015148556 A2 | 10/2015 |

OTHER PUBLICATIONS

Partial International Search Report dated Jun. 1, 2017 for corresponding International Application No. PCT/US2017/014538, 3 pages.

*Primary Examiner* — Dionne H Pendleton
(74) *Attorney, Agent, or Firm* — Larson Newman, LLP; John R. Schell (57) ABSTRACT

A method of establishing a location beacon includes establishing a bi-directional wireless radiofrequency connection between a directed light beacon device and a networked device in communication with a central server; assigning a beacon identification code to the directed light beacon device at the central server; transmitting the beacon identification code to the directed light beacon device through the bi-directional wireless radiofrequency connection; and transmitting the beacon identification code in a directed light beacon signal from the directed light beacon device.

20 Claims, 7 Drawing Sheets

(51) Int. Cl.
*H04W 4/80* (2018.01)
*H04W 8/00* (2009.01)
*G01S 1/70* (2006.01)
*H05K 7/14* (2006.01)

(58) Field of Classification Search
CPC . H04W 4/60; G06K 7/10356; G06K 7/10366; G06K 19/07794; G06K 7/0008; G06K 7/10099; G06Q 10/087; G06Q 10/08; G06Q 10/083; G06Q 10/0832; G06Q 10/0833; G06Q 50/28; G06Q 50/30; G06Q 50/32; H04B 17/318; H04L 41/0833; H04L 43/16; H04L 67/12; H04L 5/14; G01S 13/751; G01S 19/01; G01S 1/70; G01S 2013/0245; G01S 5/0236
See application file for complete search history.

(56) References Cited

U.S. PATENT DOCUMENTS

| | | |
|---|---|---|
| 2013/0027576 A1 | 1/2013 | Ryan et al. |
| 2014/0276399 A1 | 9/2014 | Bian et al. |
| 2015/0005011 A1* | 1/2015 | Nehrenz .............. H04W 4/02 455/456.3 |
| 2015/0084769 A1* | 3/2015 | Messier ........... G06K 19/07762 340/539.13 |
| 2016/0128105 A1* | 5/2016 | Dunsbergen .......... H04W 48/12 370/329 |
| 2017/0076121 A1* | 3/2017 | Felch ................ H04W 72/085 |
| 2017/0109555 A1* | 4/2017 | Koch .................... G01S 13/751 |
| 2017/0180925 A1* | 6/2017 | Taylor .................... H04W 4/02 |
| 2018/0077545 A1* | 3/2018 | Arunachalam ......... H04W 4/18 |

* cited by examiner

ASSET TRACKING SYSTEM FOR RACK-BASED ENCLOSURES

CROSS-REFERENCE TO RELATED APPLICATION(S)

This application claims benefit of U.S. Provisional Application No. 62/281,333, filed Jan. 21, 2016, which is incorporated herein by reference in its entirety.
This application claims benefit of U.S. Provisional Application No. 62/281,339, filed Jan. 21, 2016, which is incorporated herein by reference in its entirety.

FIELD OF THE DISCLOSURE

This disclosure, in general, relates to asset tracking systems and in particular, to asset tracking systems for use in tracking rack-based assets.

BACKGROUND

With the increasing complexity of commercial organizations, industry is seeking to track the location and use of inventory and equipment with increasing specificity and detail. Accordingly, various industries are turning to asset tracking systems that include electronically readable identification tags.

In particular, the information technology industry has particular interest in tracking information technology assets in data centers, particularly those disposed in equipment racks. Conventionally, such assets have been bar coded and manually scanned, requiring frequent and expensive manual data collection in order to maintain inventory and locate moved assets.

More recently, passive radio frequency identification techniques have been used, placing passive radio frequency identification (RFID) tags on the front of assets and either installing permanent RFID readers in the racks or manually visiting each rack with the scanner and opening and sweeping the scanner over the rack to find assets. However, installation of permanent readers has proven unreliable and expensive because cables and other minor obstructions interfere with the ability to read such tags. In addition, manual scanning using handheld RFID readers has ultimately proven of little value versus traditional bar code methods since it still requires a human visit to each location.

As such, an improved system and method for tracking assets, particularly information technology assets located in rack-based systems would be desirable.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION

In an exemplary embodiment, a tracking system includes a beacon device providing directed light beacon signal, such as an infrared beacon signal, to be received by tags. Aspects of the received signal are to be provided by the tags to a central server to assist with tracking the location of the tags based on the observed beacon signals. The beacon device can be a rack-based beacon device, and can, for example, have a strip of beacon lights that extend along edges of a face of a rack. In another example, the beacon device can be configured to beacon to an area or room. In a particular example, the beacon device can establish a bi-directional communication with a network device, such as a reader or network equipment within a rack, or with a mobile device, such as a designated handheld device, phone, tablet, or laptop. For example, the bidirectional communication can be a network connection, such as a Wi-Fi or Blutetooth® compliant network connection. The beacon device can communicate with the central server through the bidirectional communication.

In an example, the central server can interact with a group of beacon devices and provide to each beacon device a unique identifier to be transmitted in the beacon signal to tags or other observing devices, such as mobile or handheld devices. In another example, the central server can transmit instructions to tags by communicating the instructions to the beacon device associated with the tag. The beacon device can instruct the tag using a directed light signal, such as an infrared signal, and the tag can perform the instruction and acknowledge the instruction by transmitting an acknowledgement to the central server through the reader.

In a further example, the beacon device can receive instructions through the bidirectional communication. For example, the beacon device can receive instructions and configurations from the central server through the bidirectional communication. In another example, the beacon device can establish communication with a mobile or handheld device and receive configurations and instructions from the mobile or handheld device.

Figure 1:
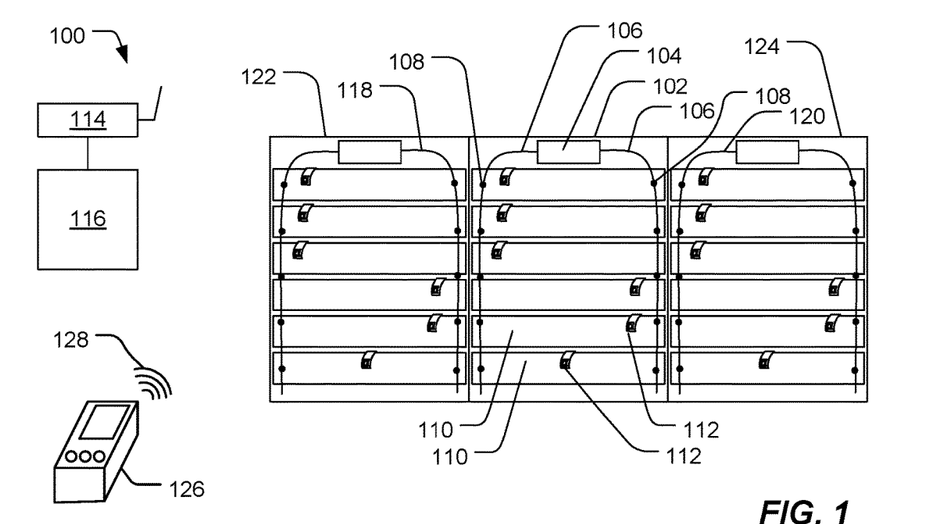
FIG. 1 includes an illustration of an exemplary tracking system.

In an example illustrated in FIG. 1, an exemplary tracking system can be disposed in a set of cabinets or racks 102 in which a set of assets 110 are located, herein referred to as rack-based systems. For example, the assets 110 can be information technology assets, such as servers, routers, power supplies, rack sensors sensing, for example, temperature, humidity, air flow, or network traffic, other rack-based equipment, or any combination thereof. As illustrated, each rack 102 can include one or more assets 110. Identification tags 112 can be disposed on the assets 110. The identification tags 112 can be responsive to directed light signals received from a beacon device 104 disposed within the rack 102 and can transmit tag messages to a reader 114 either disposed within the rack 102 or as illustrated, disposed outside of the rack 102. Directed light signals are signals transmitted in the infrared or visible light spectrums regardless of angle of incidence.

In an example, each of the beacon devices 104 can include a mounted device from which communication strips 106 extend, such as along a horizontal or vertical edge of the rack 102. For example, the communication strip 106 can extend along a vertical front edge of the track 102. Each communication strip 106 includes a plurality of directed light emitters 108 distributed along the communication strip 106.

In the illustrated example, each beacon device 104 includes at least two communication strips 106 that include a plurality of directed light emitters 108 distributed along the length of the communication strips 106. The beacon device 104 can facilitate transmission of directed light signals from the plurality of directed light emitters 108 to be received by the identification tags 112. The directed light signal can be a signal in infrared or visible light spectrums and can include an indication of location, such as the rack location or the identification code of the rack 102. In another example, the directed light signal can include an identifier associated with the beacon device 104. In a further example, the directed light signal can include instructions to be received by the tags 112.

The identification tag 112 includes a processor coupled to a receiver responsive to directed light signals, such as those emitted by the directed light emitters 108. In an example, the identification tag 112 also includes a lens to direct the directed light signal to the receiver. The identification tag 112 can also include a transmitter to transmit a tag message to a reader 114. In an example, the tag message includes an identification of the tag and an indication of location received via the directed light signal from the beacon device 104. In a particular example, the identification tag 112 can transmit via a radio frequency signal to the reader 114. In particular, the identification tag 112 can communicate at a frequency in a range of 100 MHz to 1 GHz, such as 300 MHz to 1 GHZ or 350 MHz to 600 MHz, for example, 433 MHz. Alternatively, the communication with the reader 114 can utilize a communication standard, such as a standard compliant with IEEE 802.11x or Bluetooth® (e.g., Bluetooth® 4.0). For example, the identification tag 112 can communication using a frequency in a range of between 2.0 GHz and 2.5 GHz, such as between 2.25 GHz and 2.5 GHz, or between 2.4 GHz and 2.485 GHz. The communication can include tag identifiers, commands, or data payloads, among other information. In a further example, the processor of the tag 112 can implement instructions received via the directed light signal. For example, the tag can indicate its presence through sound, vibration or light in response to instructions received via the directed light signal. In another example, the tag 112 can transmit an acknowledgment signal to the reader 114 in response to the directed light signal.

As illustrated, the reader 114 is located outside of the racks 102. Alternatively, the reader 114 can be located within a rack 102 or can have antennas extending into each of the racks 102. For example, an antenna (not illustrated) can extend into a rack 102 and can extend along a vertical or horizontal surface within the rack. The reader 114 can be coupled to a computational device 116 and can provide information associated with the tag messages received from the identification tags 112 to the computation device 116. For example, the computational device 116 can be a server, computer, or database system for storing and manipulating tag messages and processing information associated with the tag messages. The reader 114 can be connected directly to the computation device 116 or can be connected via a network, such as a local area network, a wide area network, or a global network.

In a particular example, the beacon device 104 includes two communication strips 106 that extend along a vertical front edge of a rack or cabinet 102. The identification tags 112 are disposed to lie between the communication strips 106 and extend from a front face of the assets 110. As such, the identification tags 112 are more likely to receive directed light signals from the communication strips 106 located in rack 102, than communication strips (e.g., 118 and 120) located within adjacent racks (e.g., 122 and 124). Extraneous signals are signals transmitted from devices, such as communication strips located in other racks, other than the communication strips 106 associated with the rack in which the identification tags 112 are disposed. Noise includes directed light, such as infrared or visible light, that does not include data to be interpreted by a receiver of the identification tags 112. To further limit processing of extraneous signals, directed light signals can be transmitted through the communication strips 106 using protocols that rely on a two-communication strip configuration. For example, a directed light signal can be transmitted from a first communication strip at a first time and from a second communication strip at a second time. The identification tags 112 can be configured to process the directed light signal after receiving two of the same signals at different times, the second signal confirming the first signal. In another example, a first communication strip can transmit a first portion of a directed light signal and a second communication strip can transmit a second portion of the directed light signal. As such, identification tags not located between the first and second communication strips are less likely to receive both parts of the directed light signal. In a further example, first and second communication strips 106 can transmit the same directed light signal simultaneously. For example, the transmitted directed light signal from any one communication strip can have a strength less than or equal to ambient noise, but the sum of the strengths of the directed light signals can be greater than ambient noise. As such, an identification tag 112 located between the communication strips 106 is more likely to interpret the directed light signal as a signal and not noise, whereas the directed light signal can appear as noise to identification tags not located between the communication strips 106.

In another example, the beacon devices 104 can establish a bidirectional communication or network connection with the reader 114 or equipment coupled to a network and in communication with the central computational device 116. For example, the beacon device 104 can communicate with the reader 114 using a network connection similar to the connection of the tags 112. In another example, the deacon device 104 can communicate with networked equipment, such as equipment within the rack. For example, the beacon device 104 can establish wireless communication using protocols such as IEEE 802.11x (e.g., IEEE 802.11 a/b/g/n), IEEE 802.15, IEEE 802.16, IEEE 802.15.3, Bluetooth® (e.g., Bluetooth® 4.0), ZigBee, a proprietary communication circuitry, or any combination thereof. In a particular example, the wireless protocol can be a Bluetooth® Classic or LE protocol, for example, compliant with Bluetooth® 4.0 standards. In particular, the central computer 116 can provide configuration parameters, identifiers, and instructions to the beacon device 104.

In a particular example, the beacon device 104 can provide an advertising or beacon signal, such as an advertising signal over multiple channels. A reader 114 or networked equipment receiving the advertising or beacon signal can offer a network connection. In another example, a reader 114 can advertise a network on a single channel and act as a host or wireless access point for a wireless network.

In a further example, the system 100 can include a mobile or handheld device 126, such as a proprietary handheld device, mobile phone, tablet, or laptop. In an alternative example, aspects of the system can be implemented on mobile devices mounted on vehicles. The mobile device 126 can communicate with the reader to exchange data with the central computer 116 via the reader 114. In a further example, the beacon device 104 can transmit advertising or beacon signals that can be received by the mobile device 126, and the mobile device 126 can optionally establish a network connection with the beacon device 104. Alternatively, the mobile device 126 can transmit advertising or beacon signals 128 that can be detected by the beacon device 104 and optionally, can establish a network connection with the beacon device 104. In an example, the mobile device 126 can communication with a wireless signal, for example, using a WiFi or Bluetooth protocol. In particular, the mobile device 126 can provide configuration parameters, identifiers, or instructions to the beacon device 104. For example, a user can configure a beacon device 104 using the mobile device 126. In another example, the central computer 116 can configure the beacon device 104 through the mobile device 126. In addition, the mobile device 126 can determine its location based on the advertising or beacon signals it receives from the beacon device 104.

Figure 2:
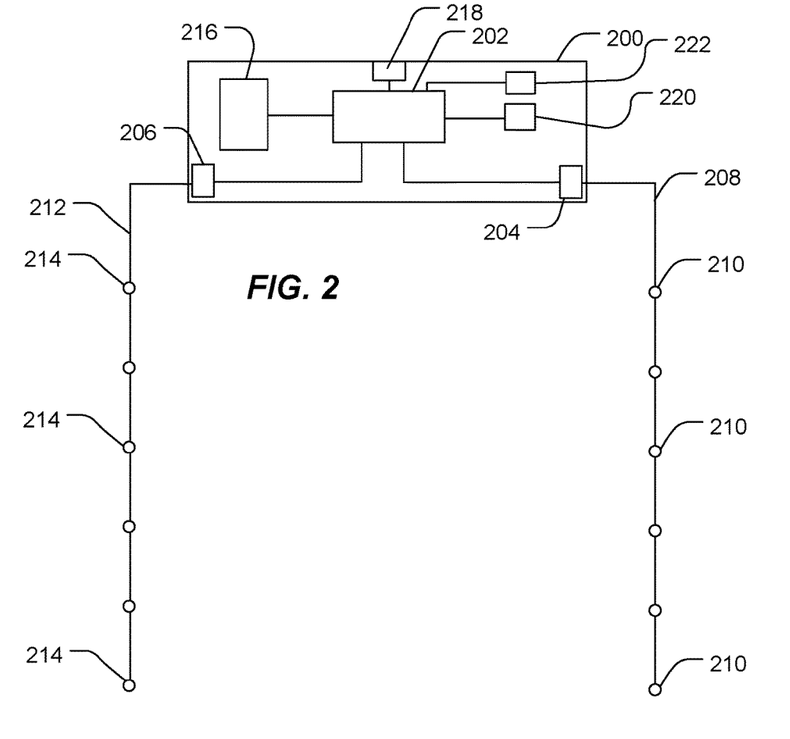
FIG. 2 includes an illustration of an exemplary beacon device.

In a further example illustrated in FIG. 2, an asset tracking system includes a beacon device 200. In an example, the beacon device 200 includes a processor 202 in communication with a communication strip, such as communication strips 208 and 212. The beacon device 200 can also include an external communication port 218, a power supply 216, and sensors 220. The processor 202 can facilitate communication of a directed light signal via the one or more communication strips 208 or 212. The communication strips 208 or 212 can include a plurality of directed light emitters 210 or 214 distributed along the length of the communication strips 208 or 212. For example, the directed light emitters 210 or 214 can include light emitting diodes, such as infrared light emitting diodes. In another example, the directed light emitters 210 or 214 can include terminal ends of optical fibers or slits on optical fibers, or other reflective mechanisms within optical fibers. In an example, the communication strip 208 or 212 can be a wire or multiple wires extending to light emitting diode (LED) emitters. The beacon device 200 can include current sensors to determine power consumption of each LED. The current sensor can indicate when an LED or bulb is out, how bright the directed light transmission is, or other conditions associated with the LED or bulb emitter. In another example, directed light, such as infrared directed light, can be transmitted from a source 204 or 206 through an optical fiber or a 4-channel fiber optic cable forming the communication strip 208 or 212. The optical fiber or fibers can be scored periodically along their length to effect directed light emitters 210 or 214. In an example, the communication strip (208 or 212) includes at least 3 emitters, such as at least 4 emitters, at least 6 emitters or even at least 10 emitters.

In addition to the emitters used to provide the directed light signals, the beacon device 200 can include visible light emitters useful for visibly indicating its presence, acknowledging instructions, or indicating an error state. Such additional emitters can be disposed on the main device or on the strips 208 or 212. In an example, the additional emitters can flash in a pattern or programmed sequence to provide a visual indication of presence or state. In a further example, the additional emitters can be modulated in a sequence incorporating more than one beacon device, for example, among groups of devices, providing a que as to grouping or providing aesthetic visual effects.

In a particular example, the communication strip (208 or 212) is in the form of an elongated member having a diameter or width and a length, the length being longer than the diameter or width. In an example, the communication strip (208 or 212) has a strip aspect ratio defined as the ratio of the length to the width or diameter, of at least 10, such as at least 20 or even at least 30. As such, a narrow communication strip having the directed light emitters 210 or 214 distributed along the length of the communication strip 208 or 212 can be disposed along an edge of a rack system, such as a horizontal edge or a vertical edge of the rack system.

The beacon device 200 can be attached on the inside of a rack. For example, the beacon device 200 can be attached to the underside of a top of the rack. In another example, the beacon device 200 can be configured to fit in a space of the rack. In a particular example, an adhesive tape can be used to secure the beacon device 200 to the underside of the top of the rack.

The beacon device 200 can include an external communication port 218 coupled to the processor 202. In an example, the external communication port 218 can be a wired communication port or a wireless communication port. In an example, a wireless communication port can communicate using protocols such as IEEE 802.11 a/b/g/n, IEEE 802.15, IEEE 802.16, IEEE 802.15.3, Bluetooth® (e.g., Bluetooth® 4.0), ZigBee, a proprietary communication protocol, or any combination thereof. In a particular example, the wireless protocol can be a Bluetooth® Classic or low energy (LE) protocol, for example, compliant with Bluetooth® 4.0 standards. A wired communication circuitry can include circuitry to communicate via Ethernet, parallel port, a serial port, a universal serial bus (USB) port, or any combination thereof.

In a particular example, the external communications port 218 can communication using a wireless protocol, such as a Bluetooth® Classic or LE wireless protocol. In an example, the external communications port 218 can include an antenna to broadcast an advertising or beacon signal to another device, such as the networked rack-based equipment or a handheld device. In response to receiving an offer from the reader or equipment, the beacon device can join a wireless network or connection with the reader or equipment. Alternatively, the external communications port 218 can listen for advertising or beacon signals and optionally, offer network connections to other devices in response to the advertising or beacon signals.

In an example, the beacon device 200 can be provided with an identifier. For example, the identifier can be associated with the identity of the beacon device 200, can be associated with a location of the beacon device 200, or a combination thereof. The processor 202 can direct communication strips 208 or 212 to communicate a directed light signal indicative of the identifier of the beacon device 200. In such a manner, identification tags can receive the signal indicative of the identity of the beacon device 200 and can transmit a tagged message to a reader to indicate the location of the tag and its associated asset.

In a further example, the processor 202 can facilitate transmission of a directed light signal that includes instructions to which the processor of the tag is responsive. For example, the beacon device 200 can receive instructions from an external device via the communication port 218 to instruct a particular tag to provide a visual, vibrational, or acoustic signal indicating its location. The processor 202 can facilitate transmission of a directed light signal via the emitters 210 or 214 that includes instructions to which a particular identification tag is responsive. For example, the instructions can include the identity of a tag and instructions to the tag to emit an acoustic signal or activate a light emitting diode (LED).

The beacon device 200 can include a power supply 216 coupled to the processor 202, suppling power to the processor 202 and other equipment either directly or indirectly. The power supply 216 can include a stand-alone power supply, such as a battery. In another example, the power supply 216 can derive power from line power. In a further example, the power supply 216 can be derived from a USB source.

Further, the beacon device 200 can include a memory 222 coupled to the processor 202. For example, the memory 222 can store instructions operable by the processor to perform methods described here or can store data, such as sensor data, parameters, or identifiers. Further, the beacon device 200 can include one or more sensors 220 coupled to the processor 202. For example, the sensors 220 can include temperature sensors, air flow sensors, humidity sensors, ambient light sensors, door sensors, motion sensors, current sensors, or any combination thereof. The beacon device 200 can be responsive to the data from the sensors or can include data from the sensors in beacon signals.

For example, the beacon device 200 can include a door sensor 220. When the door is opened, the beacon device 200 can instruct identification tags in proximity to the communication strips to power up in the case of tags having such a feature. Further, the beacon device 200 can power up in response to a door opening and listen for a communication signal from a handheld device or via a network. In such a case, an individual approaching a rack in search of an asset within the rack can instruct the beacon device 200 to transmit a signal to identification tags to emit an acoustic or light signal to indicate which identification tag is associated with the desired asset. When the door is closed, the beacon device 200 can power down to conserve power or can instruct identification tags to either power down or to anticipate a period of time in which a beacon message indicative of location is not to be received. In particular, the deacon device 200 can enter a low duty cycle mode or instruct the identification tags to enter a low duty cycle mode, transmitting less frequently. In contrast to prior systems, such a system can conserve power both in the tags and at the beacon device allowing the beacon device to run on battery power.

In a further example, the processor 202 can facilitate transmission of signals indicative of ambient noise via emitters 210 or 214 to influence variable gain filters associated with the receivers on identification tags. In such a manner, the beacon device 200 can influence the receiving characteristics of an identification tag to more effectively prevent extraneous directed light signals from being interpreted or processed by the identification tag. In a particular example, the beacon device 200 can include a sensor 220, such as an ambient noise sensor, in communication with the processor 202. The processor 202 can adjust artificial noise emitted by the directed light emitters 210 and 214 in response to a measurement or characteristic of the ambient noise detected by the sensor 220, such as amplitude, frequency, or modulation of the ambient noise.

In an additional exemplary embodiment, the processor 202 can direct transmission of signals via the communication strips 208 and 212 independently. For example, the processor can direct transmission of a first signal via a communication strip 208 and can direct transmission of a second signal via a communication strip 212. For example, the processor 202 can facilitate transmission of a signal first via the communication strip 208 and subsequently transmit the same signal by the communication strip 212. In such a manner, an identification tag configured to receive two signals and compare them before acting can receive a first signal from a first communication strip and a second signal from a second communication strip and act only in response to two identical signals being received. In such a case, extraneous signals received from an adjacent rack can be more effectively filtered. In another example, the processor 202 can facilitate transmission of noise, such as artificial noise via a communication strip 208 and transmission of a directed light signal via the communication strip 212. In an additional example, the processor 202 can direct a first portion of a directed light signal be transmitted by a communication strip 208 and a second portion of the directed light signal transmitted by a communication strip 212. In such a case, a tag located between two communication strips can receive a first portion of the signal from the first communication strip and a second portion of the directed light signal from a second communication strip, whereas tags located elsewhere are less likely to receive both portions of the directed light signal and thus, are less likely to act upon an extraneous portion of a directed light signal. In a further example, the processor 202 can direct visible light displays, for example, in patterns or sequences to indicate presence, state, or provide an aesthetic appearance.

The communication strips 208 and 212, for example, extend along an edge of a rack. The communication strips 208 and 212 can be mechanically secured to the rack, for example, using clips, screws, or rivets. In another example, the communication strips can be adhered to the edge of the rack using an adhesive or Velcro system. For example, pressure sensitive adhesive strips can be adhered to a back of a communication strip and secure the communication strip to an edge of a rack.

In an alternative example, the beacon device can be external to the racks or disposed in rooms, hallways or storage areas. In an example illustrated in FIG. 3, a system 300 includes a set of racks 302. Each rack 302 can store or warehouse rack-based equipment 308. Each rack 302 can include one or more rack-based observer devices and associated antenna arrays (e.g., 304 or 306). Each rack 302 defines a plurality of faces.

Figure 3:
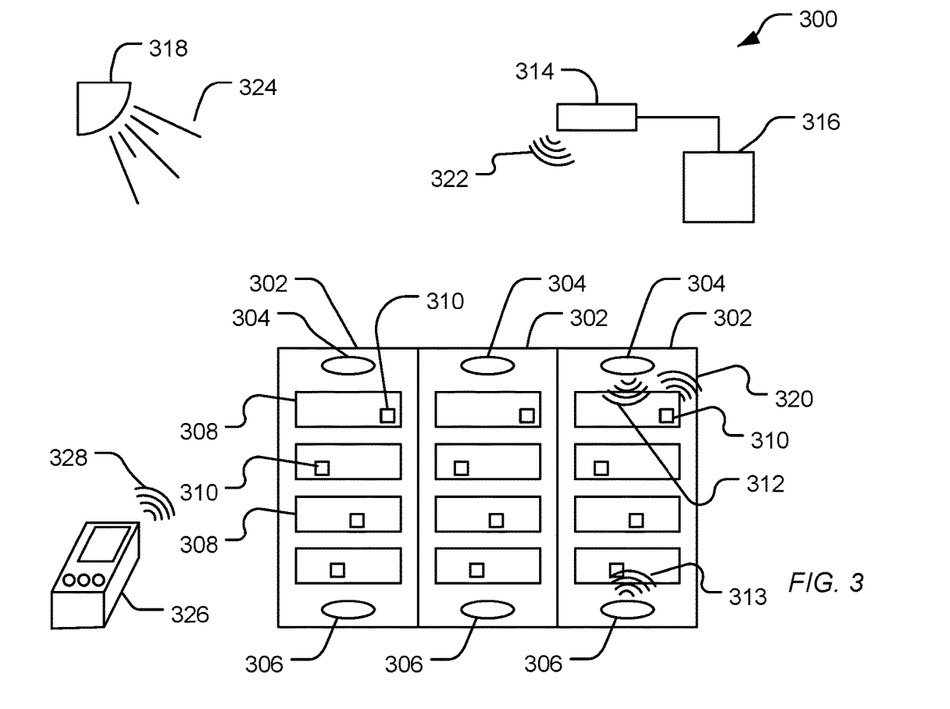
FIG. 3 includes an illustration of an exemplary tracking system.

The system 300 can further include a reader 314 connected to a central server 316. Tags 310 attached to the rack-based assets or equipment 308 can transmit advertising or beacon signals 320 that can be detected by the antenna arrays (e.g. 304 or 306) attached to a rack-based observer device. The rack-based observer devices can communicate with the reader 314 using a signals, such as a signal 312 or 313. In an example, the antenna arrays are each attached to different rack-based observer devices that each communicate with the reader, either through a wireless connection or a wired connection. In another example, a single rack-based observer device can be coupled to two or more antenna arrays 304 or 306 and communicate aspects of the tag beacon or advertising signals received at each antenna array 304 or 306 to the reader through a wireless connection or through a wired network to a central controller 316.

In an alternative example, the antenna arrays 304 or 306 can transmit advertising or beacon signals, including an identification of the antenna array. The tag 310 can detect the advertising or beacon signals, and the tag 310 can to communicate using signal 320 identifiers, data, or signal characteristics associated with the beacon signals received from the rack-based antenna arrays 304 or 306 to the reader 314. The reader 314 can provide the identifiers, data, or signal characteristics received from the tags 310 to the central server 316, where a determination as to the rack location of the tag 310 and associated rack-based asset or equipment 308 can be made. In another example, the rack-based observer devices attached to the rack-based antenna arrays 304 or 306 can serve as readers, networking with the tags 310, and can be in communication with the central server 316, such as a through a wired or wireless network interface, to communicate aspects of the beacon signals observed by the tags 310 or other data from the tags 310.

In addition, the system 300 includes an infrared beacon device 318, providing an infrared beacon signal 324 that can be received by the tags 310. The infrared beacon signal 324 can include an identifier indicative of location, such as a room or area, that can be received by the tags 310 and communicated as part of the beacon signal to the observer devices, or in a signal to the reader 314. Such location information can further be stored by the central server 316 or used in determining a location of the tag.

In an example, the beacon device 318 can also communication with the antenna arrays 304 or 306 or a reader, such as transmitting an advertising or beacon signal, using a frequency in a range of between 2.0 GHz and 2.5 GHz, such as between 2.25 GHz and 2.5 GHz, or between 2.4 GHz and 2.485 GHz. Further, the beacon device 318 or the antenna arrays 304 or 306 can be configured to emit signals having a power in a range of 0.01 W to 1.1 W, such as a range of 0.05 W to 0.7 W or a range of 0.1 W to 0.5 W.

In particular, the advertising or beacon signals from the beacon device 318 can implement a multichannel communication protocol, such as a spread spectrum communication protocol. In particularly, the advertising or beacon signal can be broadcast over 2 to 5 channels, such as 3 channels. In a particular example, the communication protocol can permit bi-directional communication.

In a further example, the system 300 can also include a mobile or handheld device 326, such as a proprietary handheld device, mobile phone, tablet, or laptop. Aspects of the handheld device 326 can also be implemented in an identification badge. In an example, the handheld device 326 can receive advertising or beacon signals from the beacon device 318 and can communicate identifiers, data, or characteristics of the advertising or beacon signals to the reader 314 using signal 328. Alternatively, the handheld device 326 can transmit advertising or beacon signals to the beacon device 318. The reader 314 can communicate the data and signal characteristics to the central server 316, which can determine a proximity of the handheld device 326 to a selected rack. The central server 316, through the reader 314, can communicate with the handheld device 326, providing instructions to signal when the handheld device is proximal to the desired rack 302. Optionally, the handheld device 326 further includes an infrared receiver to receive the directed light beacon signal 324. Identifiers or data from the infrared beacon signal 324 received at the handheld device 326 can be further communicated to the reader 314 and to the central server 316. In an example, the handheld device 326 can communicate with the reader 314 and the central server 316 to assist in finding a desired rack 302 and desired tag. Once the handheld device 326 is proximal to the desired rack 302, the handheld device 326 can provide a request to the central server 316 through the reader 314 to command a tag 310 to indicate its presence through sound or a light indicator. The signal 328 can be similar to the communication signals 322, or can include data or identifiers similar to that of the tags 310 or may include additional commands, requests, or information.

In a particular example, the handheld device 326 can communicate with the infrared device 318 using a wireless protocol, such as a Wi-Fi or Bluetooth protocol. The handheld device 326 can configure the infrared device 318, communicating through the wireless connection configuration parameters, instructions, and identifiers. For example, the handheld device 326 can provide configuration parameters, such as identification codes, signal brightness, access control, or identification labels, or firmware updates.

Figure 4:
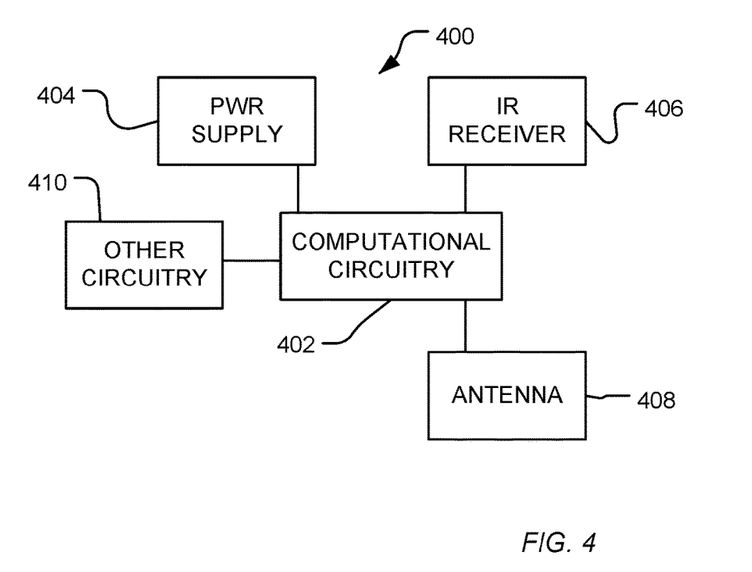
FIG. 4 includes an illustration of exemplary circuitry of a tracking tag.

In the examples above, a tag is attached to the rack-based equipment and can include antennas to transmit beacon signals and can optionally include other radio frequency (RF) antennas to communicate with the reader. Further, the tag can receive infrared beacon signals, for example, incorporating an identifier associated with the infrared beacon devices or instructions. For example, as illustrated in FIG. 4, a circuitry 400 of a tag can include computational circuitry 402, which can include processors and memory to store and implement program instructions. In additional, the computational circuitry 402 can be coupled to a power supply 404, such as a battery or line power supply, to supply power to the computational circuitry 402 and other circuitry. In addition, the computational circuitry 402 can be coupled to one or more antennas 408. For example, the computational circuitry 402 can direct an antenna 408 to broadcast an advertising or beacon signal. Alternatively the computational circuitry 402 can receive advertising or beacon signals from the rack-based antenna arrays through the antenna 408. Further, the computational circuitry 402 can direct the antenna 408 to communicate with a reader. In a particular example, the antenna 408 can be a multi-frequency antenna or a collection of different antennas.

Optionally, the tag circuitry 400 can include a directed light receiver 406 in communication with the computational circuitry 402. The direct light receiver 406 responsive to directed light signals, such as infrared signals. For example, the receiver 406 can receive infrared signals from an infrared observer device that includes an identifier indicative of location. The infrared receiver 406 can receive the infrared signal carrying the identifier, and the computational circuitry 402 can communicate the identifier through the antenna 408 to the reader or incorporate data in a beacon-like signal. Further, the infrared signal can carry instructions to be implemented by the tag, such as configuration parameters, instructions to beacon, instructions to identify itself, or instructions to send an acknowledgement signal. Such instructions can modify a tag configuration, for example, changing parameters temporarily or permanently. Example configuration parameters include enabling or disabling radiofrequency (RF) transmissions, modifying periodicity of RF transmissions, modifying the power of such RF transmissions, tailoring the format or data payloads included in transmissions, or other aspects of tag behavior. In a further example, the instructions can be to activate an actuator coupled to the tag or to take a measurement from a sensor coupled to the tag. In another example, thresholds, measurement frequencies, communication priorities, and other parameters of a tag can be configured.

In a further example, the computational circuitry 402 can be attached to other circuitry 410, such as lights, speakers, or vibration mechanisms. For example, the other circuitry 410 can include an acoustic emitter or one or more lights, such as light emitting diodes. In an example, the emitter can include one or more light emitting diodes (LED) responsive to the circuitry 402 to indicate, for example, activation of the tag circuitry 400 or the receipt of a signal via the receiver 406. In another example, the emitter 410 can be an acoustic emitter, for example, to emit acoustic signals in response to signals received via the receiver 406. Such circuitry can be activated in response to commands from a handheld device or central server to indicate is presence.

In another example, the other circuitry 410 can include one or more sensors. For example, the sensor can include a temperature sensor, a humidity sensor, a pressure sensor, an acoustic sensor, or any combination thereof. In an example, the tag circuitry 400 can include a temperature sensor to detect temperature at a rack. In another example, the tag circuitry 400 can include an acoustic sensor to detect audible alarms of rack-based equipment. In a further example, the sensor can be a capacitively driven communication circuitry accessible by external sensors or equipment. Such external sensors can be sensors forming part of rack-based assets or can include other sensors such as door sensors, power sensors, humidity sensors, liquid sensors, temperature sensors, pressure sensors, air flow sensors, or any combination thereof. In a further example, the other circuitry 410 can include actuators to activate or deactivate external devices.

In an additional example, instructions received in the directed light signal at the receiver 406 can instruct the circuitry 402 to emit a visible light signal through an emitter. In another example, such an instruction can instruct the processor to emit a sonic signal through a sonic emitter. In a further example, the instructions can instruct the circuitry 402 to send a tag message. The instructions can direct the gathering of sensor measurements, addition of payload data to tag messages, activating an actuator, or configuring thresholds, among other instructions. As such, an individual in search of a tag can receive a visual or acoustic indication of which tag is being sought and as such, can more easily identify the asset of interest. Further, the tag can be remotely directed to undertake various tasks and behaviors.

Figure 5:
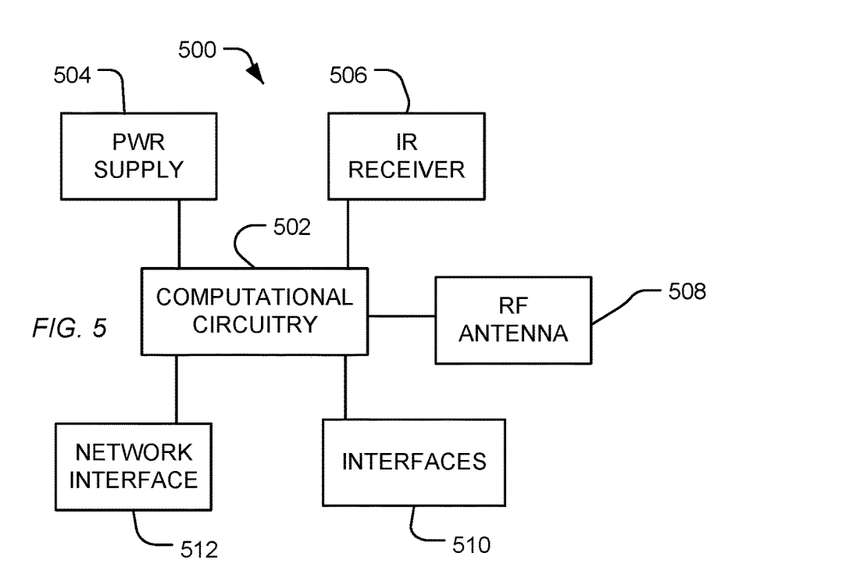
FIG. 5 includes an illustration of exemplary circuitry of a handheld device.

Optionally, the system can include a mobile or handheld device to guide a user to the desired rack and provide instruction to a particular tag or can include an active identification badge. An exemplary mobile or handheld device can include a mobile phone, tablet, or laptop. For example, as illustrated in FIG. 5, a circuitry of a mobile or handheld device 500 or active identification tag can include computational circuitry 502, which can include processors and memory to store and implement program instructions. The computational circuitry 502 can be coupled to the power supply 504, such as a battery or line power supply, to provide power to the computational circuitry 502 and other circuitry.

In an example, the computational circuitry 502 can be coupled to an antenna 508 to receive advertising or beacon signals from the directed light beacon device and can transmit aspects of the advertising or beacon signals to a central server through a reader. In an alternative example, the computational circuitry 502 can direct the transmission of advertising or beacon signals to the directed light beacon device. Such advertising and beacon signals can be RF signals. Optionally, the computational circuitry can establish an RF network connection with the directed light beacon device. The reader can communicate with a central server, which determines a location of the handheld circuitry and provides an indication through the reader to the handheld device to signal when the handheld device is located proximal to the desired rack. The antenna 508 can be a multi-frequency antenna or a collection of antennas for different frequencies. Alternatively, the computational circuitry 502 can autonomously determine its location based on data stored on the device 500.

In a further example, the handheld device 500 can communicate with a directed light beacon device, for example, through a wireless connection. In particular, the wireless connection can utilize protocols such as IEEE 802.11 a/b/g/n, IEEE 802.15, IEEE 802.16, IEEE 802.15.3, Bluetooth®, ZigBee, a proprietary communication circuitry, or any combination thereof. In a particular example, the wireless protocol can be a Bluetooth® Classic or LE protocol, for example, compliant with Bluetooth® 4.0 standards.

The computational circuitry 502 can further be coupled to an infrared receiver 506. In an example, the infrared receiver 506 can receive an infrared signal from a directed light beacon device that includes an identifier that can be used to determine location. The computational circuitry 502 can provide the identifier to the reader through the antenna 508.

The handheld device 500 can further include user interfaces 510. Exemplary user interfaces can include displays, such as touchscreen displays, buttons, switches, pointer devices, lights, vibration mechanisms, or sound devices. The computational circuitry 502 can interact with the user interface 510 to provide user interface functionality to the handheld device 500. In addition, the computational circuitry 502 can be coupled to a data interface 512, such as a USB interface or network interface. Such an interface 512 can allow for data transfer or programming or configuring the handheld device 500.

In particular, the system can implement various methods of operation utilizing the bidirectional communication with the reader, equipment, or handheld device, and the directed light communication with the tag. For example, the system can auto-assign or re-assign identification codes to directed light beacon devices to be transmitted in directed light beacon signals. In an example illustrated in FIG. 6, a method 600 includes mounting a beacon device in the rack, as illustrated at 602. For example, the beacon device can be mounted at a top edge proximal to the front face of the rack and strips of beacon lights can extend along side edges down the front face of the rack.

Figure 6:
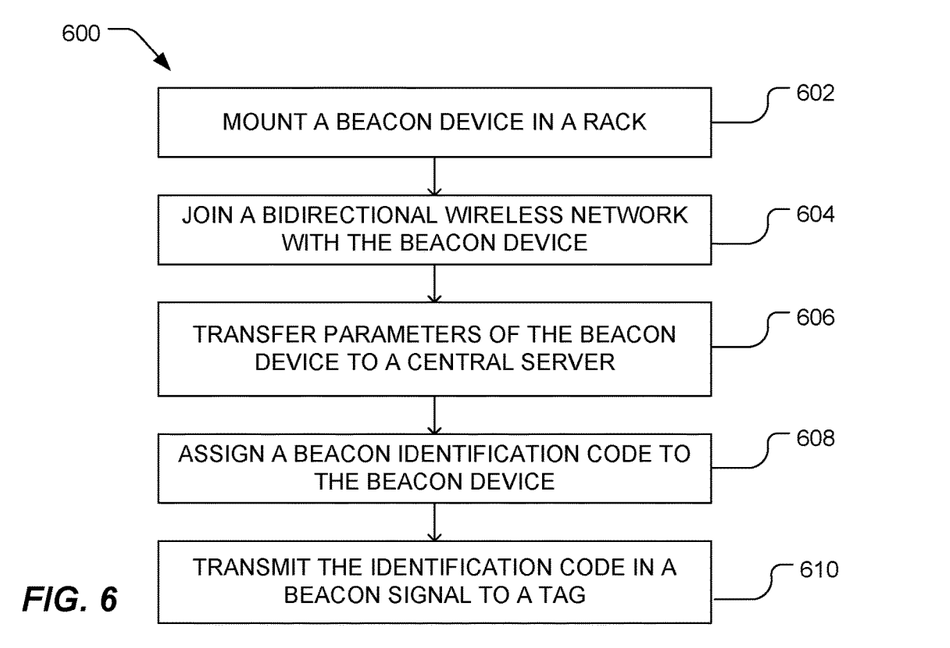
FIG. 6, FIG. 7, FIG. 8, FIG. 9, FIG. 10, FIG. 11, and FIG. 12 include flow diagrams of exemplary tracking methods.

As illustrated at 604, the beacon device can join a bidirectional wireless network. For example, the directed light beacon device can form a network connection with a reader. In another example, the directed light beacon device can form a network connection with a network device or equipment within the rack. For example, the beacon device can connect to a network device or equipment within the rack using a Bluetooth® wireless connection. Alternatively, the beacon device can be connected using a wired connection to equipment within the racks, such as through a universal serial bus (USB) port. In particular, the reader or rack equipment connected to the directed light beacon device through the bidirectional network is in communication with the central server. As such, the beacon device can communicate with the central server. In a particular example, the directed light beacon device can provide an RF advertising or beacon signal and can join a wireless network offered in response to the RF advertising or beacon signals. In another example, the directed light beacon device can join an advertised wireless network.

As illustrated at 606, the reader or the equipment within the rack connected to the beacon device via the bidirectional network can transfer parameters associated with the beacon device to the central server. For example, such parameters can conclude network addresses or identifiers associated with the beacon device, capabilities of the beacon device, or aspects of the network path used to communicate with the beacon device. The central server can store these parameters and assign the beacon device a beacon identification code, as illustrated at 608. In addition, the central server can communicate with the beacon device through the reader or equipment within the rack connecting to the beacon device using the bidirectional network and provide instructions, programming, or configuration parameters to the beacon device. In an example, the configuration parameters can include settings, such as directed light signal brightness, access control, identification labels. In addition, firmware updates can be provided.

The directed light beacon device can transmit a directed light beacon signal to be received by tags or other devices, such as mobile devices are handheld devices, such as a directed light beacon signal in an infrared or visible light spectrum. In particular, the directed light beacon signal can incorporate the identification code. For example, the beacon device can transmit the infrared or visible light beacon signal incorporating the identification code to a tag, as illustrated at 610. As a result, the tag can collect the identification code and aspects of the beacon signal for use in determining the location of the tag. For example, the tag can collect identification codes and characteristics of the beacon signals, such as signal strength (e.g., RSSI or RCPI). The identification codes and characteristics of the signal can be transmitted from the tag to a reader that transmits the identification codes and associated signal characteristics to the central server, which can determine a location of the tag.

In an example, handheld or mobile devices can also be configured to observe infrared or visible light beacon signals and associated identification codes. In such a case, the mobile or handheld device can determine its location either autonomously or through communication with a central server through a wireless connection to the reader. In an alternative example, when the beacon device is configured to receive or detect radiofrequency advertising signals, a mobile device or handheld device or a badge device can be configured to interact with the beacon device using an RF beacon signal.

In a further example, the system can be used to determine a location of an individual, audit security or correlate changes to the network equipment with the presence of an individual through the use of mobile devices or active tags. In addition, aspects of the methods can be used in conjunction with vehicles or containers. In another example illustrated in FIG. 7, a method 700 includes receiving advertising signals from beacon devices with a mobile device, as illustrated at 702. In particular, the advertising signals are radiofrequency signals that can be broadcast on multiple channels, for example sequentially. For example, the advertising or beacon signal can use a frequency in a range of between 2.0 GHz and 2.5 GHz, such as between 2.25 GHz and 2.5 GHz, or between 2.4 GHz and 2.485 GHz. Further, the signals can have a power in a range of 0.01 W to 1.1 W, such as a range of 0.05 W to 0.7 W or a range of 0.1 W to 0.5 W. For example, the advertising or beacon signals can comply with a communication protocol, such as Bluetooth® Classic or LE, for example, compliant with Bluetooth® 4.0 standards.

Figure 7:
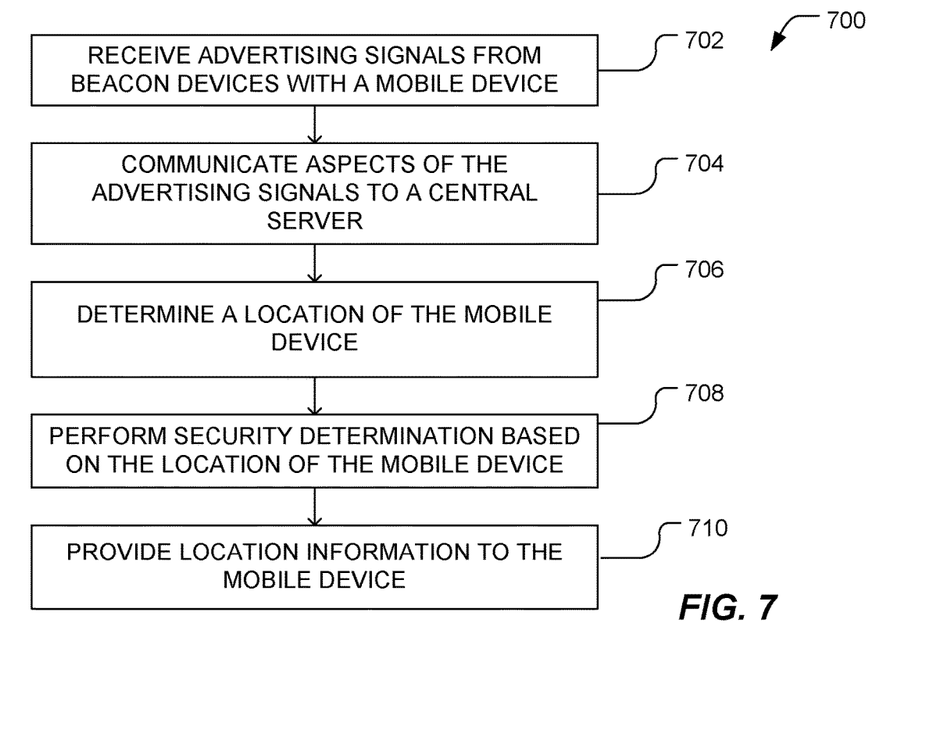

The mobile device can communicate aspects of the advertising signals to the central server, as illustrated at 704. In an example, the advertising signals or beacon signals can include identifiers associated with a device and characteristics of the advertising signals, such as signal strength, can be detected by the mobile device. Such identifiers and signal characteristics can be communicated to the central server, such as through a wireless connection to a reader.

As illustrated at 706, the location of the mobile device can be determined. For example, the central server can determine the location of the mobile device. In an alternative example, the mobile device can store a database of identifiers associated with directed light beacon devices and determine its location autonomously.

As illustrated at 708, a security determination can be made based on the location of the mobile device. In an example in which the mobile device is a handheld device associated with an individual found to be operating in an area in which he is not authorized operate, a central server can issue an alarm either on a mobile device or to a monitoring station. Whether the security determination results in an alarm condition or not, the location information can be provided to the mobile device, as illustrated at 710. For example, the mobile device can be provided with the location information to be displayed on the mobile device. As such, a handheld or mobile device can utilize such a method to locate a desired rack. In another example, badges incorporating such capability can be used to determine whether unauthorized personnel are accessing equipment. In particular, changes to the network equipment can be correlated with an individual associated with the mobile device.

Further, such a system can be used to monitor the status and states of the directed light beacon device. In another example illustrated in FIG. 8, a method 800 includes establishing communication through bidirectional wireless network, as illustrated 802. For example, the bidirectional wireless network can be a network in communication with the reader. In an alternative example, the bidirectional wireless network can be formed with equipment within a rack, such as using a Bluetooth® communication standard. As illustrated at 804, a central server can assign the beacon identification code to the beacon device through the bidirectional wireless network.

Figure 8:
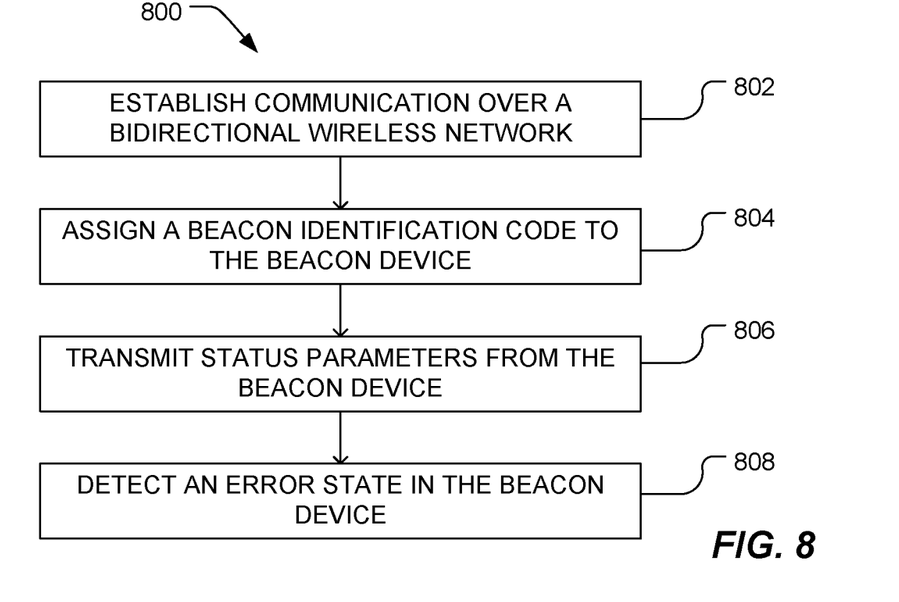

Once the bidirectional wireless network connection is established and communication is established with a central server, the beacon device can transmit status parameters to the central server, as illustrated at 806. Such status parameters can incorporate the identification or network address of the beacon device, as well as other parameters and configurations associated with the operations of the beacon device.

As illustrated at 808, the central server can detect an error state in the beacon device based on the transmissions, lack thereof, or status parameters. For example, when the beacon device fails to communicate with the central server for a period of time, the central server can determine that the beacon device has an error state. In another example, the beacon device can detect problems within its equipment such as broken beacon lights, power issues, temperature issues, or other associated operating problems and communicate such problems to the central server through the bidirectional network. In such a manner, the central server can determine an error state of the beacon device and arrange for service of the beacon device.

In an additional example, the directed light beacon device can be configured by a mobile or handheld device, such as a mobile phone, tablet, laptop, or proprietary handheld device, or can be configured from a central server. In another example illustrated in FIG. 9, a method 900 includes establishing communication between the mobile device and a directed light beacon device, as illustrated at 902. For example, the mobile device and the directed light beacon device can establish a wireless network, such as a Bluetooth® wireless network.

Figure 9:
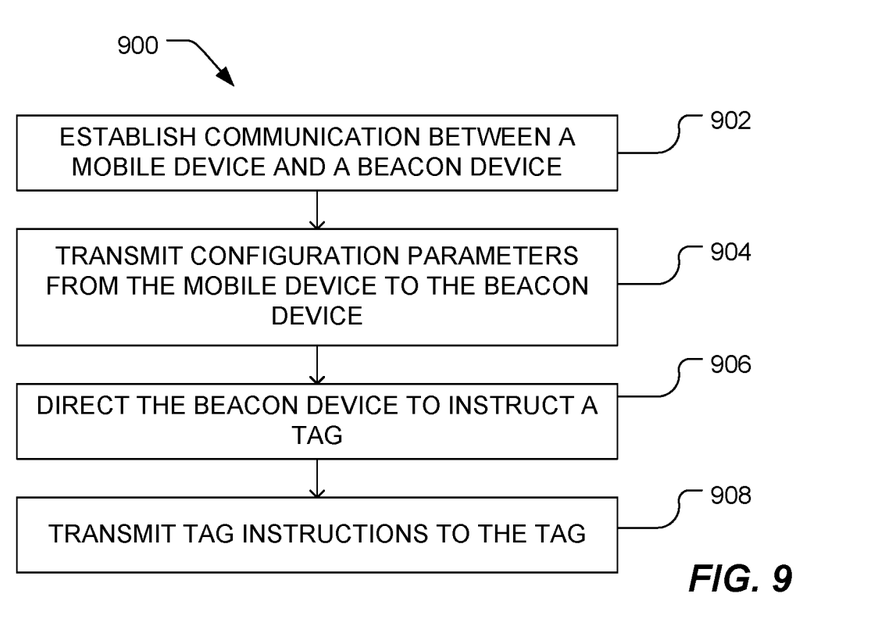

As illustrated at 904, the mobile device can transmit configuration parameters to the beacon device. For example, the mobile device can provide an identification code to the beacon device. In another example, the mobile device can configure the beacon device to transmit signals at a specified periodicity, strength, or configuration. For example, the mobile device can provide instructions, programming, or configuration parameters to the beacon device. In an example, the configuration parameters can include settings, such as directed light signal brightness, access control, identification labels. In addition, firmware updates can be provided. The beacon device can communicate with the mobile device using the configuration parameters.

In a particular example, the mobile device can transmit instructions to the beacon device and direct the beacon device to signal a tag. For example, the mobile device or handheld device can direct the beacon device to send instructions to a tag to signal its presence, as illustrated at 906.

The beacon device can transmit the tag instructions to the tag using a directed light signal, such an infrared signal, as illustrated at 908. For example, the tag instructions can instruct the tag to identify its presence, such as through a light signal, sound or vibration. In a further example, the tag instructions can direct the tag to communicate with a reader to confirm receive the instructions and its compliance with the instructions. In particular, the tag can be directed to light or blink with a specific pattern or frequency or for a prescribed period to aid in locating the tag. In another example, the tag can activate a piezoelectric speaker or other audio output to emit patterns and frequencies of sound. In an additional example, tag can be directed to collect data and initiate transmission of the data to a reader or central server. In a further example, the directed light beacon device can be directed to provide light or sound signals in prescribed patterns to aid in locating a particular rack in which a desired tag is to be found.

The reader can communicate such an acknowledgement communication to a central server, which can then communicate acknowledgment of the instructions to the mobile device or handheld device.

Figure 10:
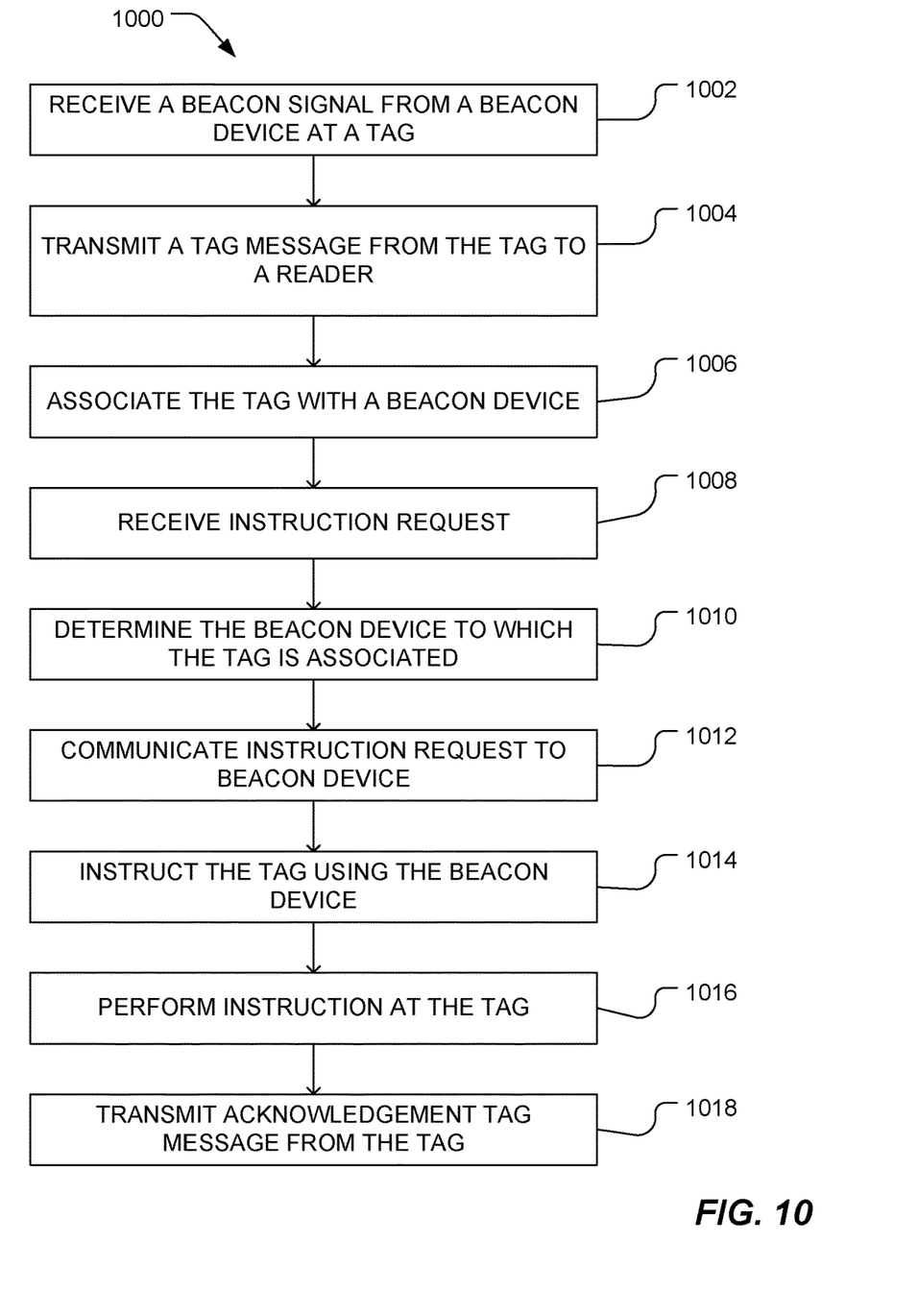

In a further example illustrated in FIG. 10, a method 1000 includes receiving a beacon signal from beacon device at a tag, as illustrated at 1002. For example, the beacon signal can be a directed light signal, such as an infrared beacon signal. The beacon signal can include an identifier and optionally instructions to the tag.

As illustrated at 1004, the tag can transmit a tag message from the tag to the reader. The tag message can include an identity of the tag. In addition, the tag message can include an identifier associated with the beacon device included in the beacon signal and aspects of the beacon signal. In an example, the beacon signal further includes instructions to the tag, and the tag can include an acknowledgment within the tag message transmitted to the reader.

As illustrated at 1006, the tag can be associated with the beacon device. For example, the tag can receive several beacon signals from several different beacon devices, and the identifiers and characteristics of the signal can be transmitted by the tag to the reader and to a central server, which can determine to which beacon device the tag should be associated.

As illustrated at 1008, the central server can receive an instruction request associated with the tag. For example, the instruction request can include a request to instruct the tag to signal its presence and acknowledge its receipt of the instructions. The central server can determine to which beacon device the tag is associated, as illustrated at 1010. In particular, the central server can reference a database formed when associating tags with beacon devices.

As illustrated at 1012, the instruction request can be communicated to the beacon device, such as through a bidirectional network established between the beacon device and a reader, the beacon device and equipment within the rack, or the beacon device and a mobile device.

As illustrated at 1014, the beacon device can instruct the tag using an infrared signal, and the tag can perform the instructions, as illustrated at 1016. For example, the tag can be directed to signal its presence, provide acknowledgment, change its parameters for transmitting signals or other aspects of the tags behavior. The tag can be configured with updated parameters or firmware. In particular, the tag can be directed to light or blink with a specific pattern or frequency or for a prescribed period to aid in locating the tag. In another example, the tag can activate a piezoelectric speaker or other audio output to emit patterns and frequencies of sound. In an additional example, tag can be directed to collect data and initiate transmission of the data to a reader or central server. Optionally, the tag can be instructed to activate an actuator to implement a secondary effect, such as turn a device on or off. In an additional example, the tag can be provided with thresholds to compare to data and in response provide alerts. In another example, the tag can be provided with a prioritization of pending actions to implement responses to asynchronous requests. In particular, the parameters can be dynamically updated, such as tag identifications, group codes, beacon rates, interval configurations, RF gain, algorithmic parameters, clock rates, infrared sampling intervals, or code tables.

Once the tag has implemented the instructions, the tag can transmit an acknowledgment tag message, for example, to the reader, as illustrated at 1018. The reader can communicate the acknowledgment to the central server and optionally, a mobile or handheld device can be notified of acknowledgment by the tag.

In another example, the system can be used to audit location and secure assets. In a further example illustrated in FIG. 11, a method 1100 can include auditing tag locations in comparison to tag association to beacon devices, as illustrated at 1102. For example, tag messages received from tags can periodically incorporate identifiers associated with infrared beacon signals received from the beacon devices. Such identifiers can be compared with the expected location of the tag and identifiers associated with the expected location.

Figure 11:
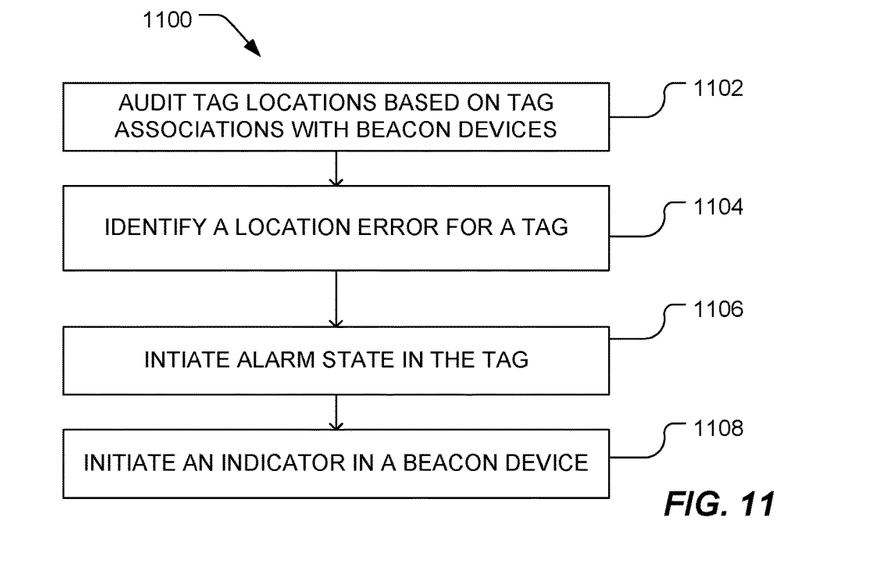

As illustrated at 1104, the central server can identify a location of the tag. For example, a tag can detect a strong signal from a beacon device other than the beacon device associated with the location at which the tag should be. In another example, the tag can indicate an absence of a beacon signal or in an associated identifier.

In response to identification of the location error, the system can instruct tag to initiate an alarm state, as illustrated at 1106. For example, the tag can make a sound or provide a light or vibration to indicate an alarm state. In another example, as illustrated at 1108, an indicator and a beacon device can be initiated to indicate the alarm state. For example, when a tag is associated with an incorrect beacon device, the incorrect beacon device can signal, for example, with light strips, to indicate that there is an erroneous tag associated with the beacon device.

In particular, the system can be used to update tag behaviors and parameters, particularly in relation to communication parameters. In an example illustrated in FIG. 12, a method 1200 includes receiving a tag message from a tag, as illustrated at 1202. For example, a reader can receive a tag message from the tag. The tag messages can include an identity of the tag and can include identifiers associated with infrared beacon signals and associated characteristics of the signals.

Figure 12:
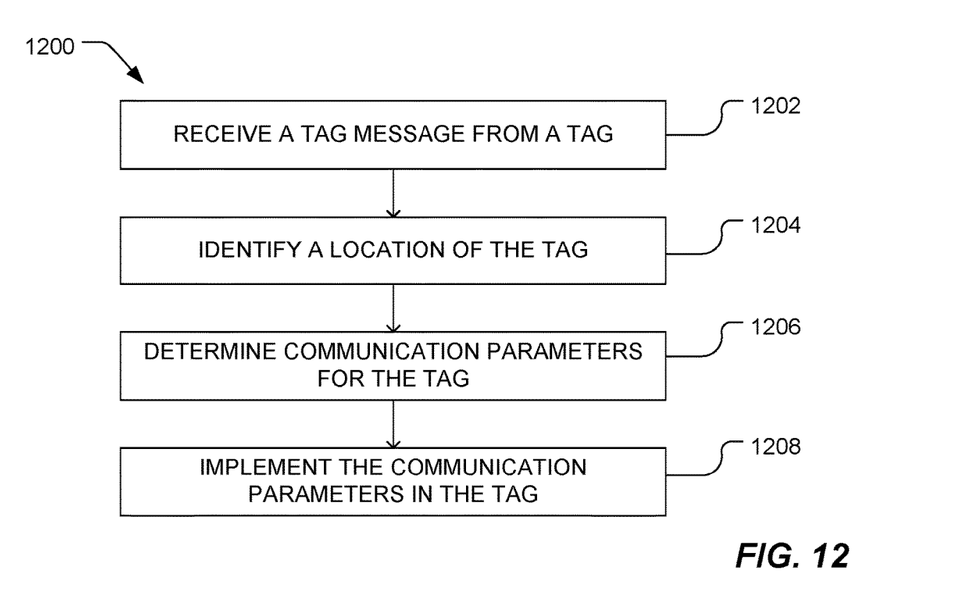

As illustrated at 1204, a central server can determine the location of the tag. For example, the tag can be located in a rack associated with the rack-based beacon device. In another example, the tag can be outside of a rack and can instead be associated with an area beacon device, such as a beacon device associated with the room or storage area.

Based on the determined location, a central server can determine communication parameters to be used by the tag, as illustrated at 1206. For example, rack-based equipment having attached tags rarely move. As such, the associated periodicity with which the tag is to communicate with the central server to indicate its location can be desirably less often than tags that are on the move or not secured within a rack. In another example, when it is determined that the tag is not associated with equipment, the tags transmissions can be limited or turned off to prevents loss of battery power or interference with other tags.

The communication parameters can be communicate with the tag, for example, using the infrared signal of a beacon device. As illustrated at 1208, the tag can implement the communication parameters appropriate for its location and situation. In another example, the tag can be provided with a prioritization of pending actions to implement responses to asynchronous requests. In particular, the parameters can be dynamically updated, such as tag identifications, group codes, beacon rates, interval configurations, RF gain, algorithmic parameters, clock rates, infrared sampling intervals, or code tables.

In a first aspect, a method of establishing a location beacon includes establishing a bi-directional wireless radiofrequency connection between a directed light beacon device and a networked device in communication with a central server; assigning a beacon identification code to the directed light beacon device at the central server; transmitting the beacon identification code to the directed light beacon device through the bi-directional wireless radiofrequency connection; and transmitting the beacon identification code in a directed light beacon signal from the directed light beacon device.

In an example of the first aspect, the method further includes receiving the directed light beacon signal at a tag, and transmitting the beacon identification code and a characteristic of the directed light beacon signal to a reader in communication with the central server. For example, the method can further includes determining a location of the tag based on the beacon identification code and the characteristic of the directed light beacon signal.

In another example of the first aspect and the above examples, the method further includes transferring a configuration parameter to the directed light beacon device from the central server. For example, the configuration parameter includes a brightness parameter. In another example, the configuration parameter includes a beacon periodicity.

In a further example of the first aspect and the above examples, the directed light beacon device is disposed in a rack and the networked device is disposed in the rack.

In another example of the first aspect and the above examples, the networked device is a reader disposed outside of a rack.

In an additional example of the first aspect and the above examples, the bi-directional wireless radiofrequency connection is compliant with the Bluetooth 4.0 standard.

In another example of the first aspect and the above examples, establishing the bi-directional wireless radiofrequency connection includes providing an advertising signal from the directed light beacon device. For example, the advertising signal is transmitted on multiple channels. In another example, the method can further includes receiving an offer to connect with the networked device at the directed light beacon device.

In a further example of the first aspect and the above examples, the method further includes receiving configuration parameters at the directed light beacon device through the bi-directional wireless radiofrequency connection.

In an additional example of the first aspect and the above examples, the method further includes receiving instructions at the directed light beacon device through the bi-directional wireless radiofrequency connection to provide indication of its presence. For example, the indication includes a visible light display.

In another example of the first aspect and the above examples, the method further includes transmitting a status parameter from the directed light beacon device to the central server through the bi-directional wireless radiofrequency connection. For example, the status parameter is associated with a state of a beacon light strip. In another example, the method further includes determining an error state of the directed light beacon device at the central server based on the transmitting the status parameters. In a further example, the error state is determined based on an absence of the transmitting the status parameter for a duration. In an additional example, the error state is determined based on a value of the status parameter.

In a second aspect, a method of configuring a directed light beacon device includes establishing a bi-directional radiofrequency connection with the directed light beacon device from a mobile device, the directed light beacon device providing a directed light signal; transferring configuration parameters from the mobile device to the directed light beacon device through the bi-directional radiofrequency connection; and transmitting a directed light beacon signal in compliance with the configuration parameters.

In an example of the second aspect and the above examples, the configuration parameter includes a directed light beacon signal brightness.

In another example of the second aspect and the above examples, the configuration parameter includes an identification code to be included in the directed light beacon signal.

In an additional example of the second aspect and the above examples, the configuration parameter includes a beacon rate.

In a further example of the second aspect and the above examples, the method further including transferring a firmware update from the mobile device to the directed light beacon device.

In another example of the second aspect and the above examples, the method further including instructing the directed light beacon device through the bi-directional radiofrequency communication to provide an instruction to a tag and transmitting the instruction to the tag through the directed light signal.

In a further example of the second aspect and the above examples, the instruction directs the tag to indicate the tag's presence, further comprising indicating the tag's presence with the tag. For example, indicating the tag's presence including lighting a visible light emitter of the tag. In an example, indicating the tag's presence including initiating an audio signal from the tag. In another example, the method further includes transmitting an acknowledgement message from the tag to a reader in communication with the central server.

In a third aspect, a method of auditing security includes receiving radiofrequency advertising signals from a set of directed light beacon devices, each radiofrequency advertising signal of the radiofrequency advertising signals including a beacon device address associated with a directed light beacon device of the set of directed light beacon devices emitting the each radiofrequency advertising signal, the directed light beacon device providing a directed light beacon signal including a beacon device identifier; communicating the beacon device addresses and aspects of the radiofrequency advertising signals to a central server through a wireless network; and determining a location of the mobile device based on the beacon device addresses and aspects of the radiofrequency advertising signals.

In an example of the third aspect, the method further includes performing a security determination based on the determined location of the mobile device.

In another example of the third aspect and the above examples, the method further includes selectively establishing an alarm state in response to the performing a security determination.

In a further example of the third aspect and the above examples, the method further includes providing the determined location to the mobile device and providing an indication on an interface of the mobile device of the determined location.

In an additional example of the third aspect and the above examples, the method further includes correlating a change in a network equipment to the mobile device based on the determined location.

In another example of the third aspect and the above examples, the method further includes directing a directed light beacon device of the set of directed light beacon devices to indicate its presence based on the determined location.

In a further example of the third aspect and the above examples, the method further includes instructing the set of directed light beacon devices to provide a light sequence based on the determined location.

In a fourth aspect, a method of directing a behavior of a tag includes receiving an instruction request at a central server, the instruction request identifying a tag; determining a directed light beacon device associated with a location of the tag; communicating the instruction request to the directed light beacon device; and transmitting instructions associated with the instruction request to the tag from the directed light beacon device using a directed light signal.

In an example of the fourth aspect, communicating the instruction request to the directed light beacon device includes communicating the instruction request over a bi-directional radiofrequency network to which the directed light beacon device is connected.

In another example of the fourth aspect and the above examples, the instructions direct the tag to indicate the tag's presence, further comprising indicating the tag's presence with the tag. For example, indicating the tag's presence including lighting a visible light emitter of the tag. In another example, indicating the tag's presence including initiating an audio signal from the tag. In additional example, the method further includes transmitting an acknowledgement message from the tag to a reader in communication with the central server.

In a further example of the fourth aspect and the above examples, the instructions include communication parameters, further comprising providing radiofrequency communications from the tag using the communication parameters. For example, the communication parameters include a power parameter. In another example, the communication parameters include a periodicity. For example, the communication parameters include an interval. In another example, the communication parameters include an enable/disable parameter.

In an additional example of the fourth aspect and the above examples, the instructions include a threshold associated with sensor measurements, further comprising providing radiofrequency communications from the tag based on the threshold and sensor measurements.

In another example of the fourth aspect and the above examples, the instructions include a direction to activate an actuator, further comprising activating the actuator with the tag.

In a further example of the fourth aspect and the above examples, the instructions include a prioritization associated with asynchronous communications, further comprising implementing the prioritization by the tag.

In an additional example of the fourth aspect and the above examples, the method further includes transmitting the instruction request from a mobile device.

In another example of the fourth aspect and the above examples, the method further includes determining a location of the tag prior to receiving the instruction request.

In a fifth aspect, a method for controlling communication from a tag includes receiving a directed light beacon signal at a tag, the directed light beacon signal including a beacon identifier; transmitting the beacon identifier from the tag to a reader, the reader in communication with a central server; determining a location of the tag using the central server based on the beacon identifier; selecting communication parameters based on the location; and implementing the communication parameters using the tag.

In an example of the fifth aspect, implementing the communication parameters includes determining a directed light beacon device associated with the tag; and transmitting the communication parameters in a directed light signal from the directed light beacon device to the tag.

In another example of the fifth aspect and the above examples, the communication parameters include a power parameter.

In a further example of the fifth aspect and the above examples, the communication parameters include a periodicity.

In an additional example of the fifth aspect and the above examples, the communication parameters include an interval.

In another example of the fifth aspect and the above examples, the communication parameters include an enable/disable parameter.

In a further example of the fifth aspect and the above examples, the method further includes transmitting an acknowledgment message from the tag to the reader in response to implementing the communication parameters.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" are employed to describe elements and components described herein. This is done merely for convenience and to give a general sense of the scope of the invention. This description should be read to include one or at least one and the singular also includes the plural unless it is obvious that it is meant otherwise.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

After reading the specification, skilled artisans will appreciate that certain features are, for clarity, described herein in the context of separate embodiments, may also be provided in combination in a single embodiment. Conversely, various features that are, for brevity, described in the context of a single embodiment, may also be provided separately or in any subcombination. Further, references to values stated in ranges include each and every value within that range.

What is claimed is:

1. A method of establishing a location beacon, the method comprising:
    establishing a bi-directional wireless radiofrequency connection between a directed light beacon device and a networked device in communication with a central server;
    assigning a beacon identification code to the directed light beacon device at the central server;
    transmitting the beacon identification code to the directed light beacon device through the bi-directional wireless radiofrequency connection;
    transmitting the beacon identification code in a directed light beacon signal from the directed light beacon device; and
    transmitting a status parameter from the directed light beacon device to the central server through the bi-directional wireless radio-frequency connection, wherein the status parameter is associated with a state of a beacon light strip.

2. The method of claim 1, further comprising receiving the directed light beacon signal at a tag, and transmitting the beacon identification code and a characteristic of the directed light beacon signal to a reader in communication with the central server.

3. The method of claim 2, further comprising determining a location of the tag based on the beacon identification code and the characteristic of the directed light beacon signal.

4. The method of claim 1, further comprising transferring a configuration parameter to the directed light beacon device from the central server.

5. The method of claim 4, wherein the configuration parameter includes a brightness parameter.

6. The method of claim 4, wherein the configuration parameter includes a beacon periodicity.

7. The method of claim 1, wherein the directed light beacon device is disposed in a rack and the networked device is disposed in the rack.

8. The method of claim 1, wherein the networked device is a reader disposed outside of a rack.

9. The method of claim 1, wherein the bi-directional wireless radiofrequency connection is compliant with the Bluetooth 4.0 standard.

10. The method of claim 1, wherein establishing the bi-directional wireless radiofrequency connection includes providing an advertising signal from the directed light beacon device.

11. The method of claim 10, wherein the advertising signal is transmitted on multiple channels.

12. The method of claim 10, further comprising receiving an offer to connect with the networked device at the directed light beacon device.

13. The method of claim 1, further comprising receiving configuration parameters at the directed light beacon device through the bi-directional wireless radiofrequency connection.

14. The method of claim 1, further comprising receiving instructions at the directed light beacon device through the bi-directional wireless radiofrequency connection to provide indication of its presence.

15. The method of claim 14, wherein the indication includes a visible light display.

16. The method of claim 1, further comprising determining an error state of the directed light beacon device at the central server based on the transmitting the status parameters.

17. The method of claim 16, wherein the error state is determined based on an absence of the transmitting the status parameter for a duration.

18. The method of claim 16, wherein the error state is determined based on a value of the status parameter.

19. The method of claim 1, further comprising instructing the directed light beacon device through the bi-directional radiofrequency connection to provide an instruction to a tag and transmitting the instruction to the tag through the directed light signal.

20. The method of claim 19, wherein the instruction directs the tag to indicate the tag's presence, further comprising indicating the tag's presence with the tag.

* * * * *